United States Patent
August et al.

(10) Patent No.: US 9,336,873 B2
(45) Date of Patent: May 10, 2016

(54) APPARATUS FOR TIME DOMAIN OFFSET CANCELLATION TO IMPROVE SENSING MARGIN RESISTIVE MEMORIES

(71) Applicants: Nathaniel J. August, Portland, OR (US); Liqiong Wei, Portland, OR (US)

(72) Inventors: Nathaniel J. August, Portland, OR (US); Liqiong Wei, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 110 days.

(21) Appl. No.: 14/094,488

(22) Filed: Dec. 2, 2013

(65) Prior Publication Data
US 2015/0155036 A1    Jun. 4, 2015

(51) Int. Cl.
G11C 11/00 (2006.01)
G11C 13/00 (2006.01)
G11C 7/22 (2006.01)
G11C 11/16 (2006.01)

(52) U.S. Cl.
CPC ............ *G11C 13/0061* (2013.01); *G11C 7/227* (2013.01); *G11C 11/1693* (2013.01)

(58) Field of Classification Search
USPC .......................................................... 365/148
See application file for complete search history.

(56) References Cited

U.S. PATENT DOCUMENTS

| | | | | |
|---|---|---|---|---|
| 6,577,525 B2 * | 6/2003 | Baker | ..................... | G11C 11/14 365/148 |
| 6,661,708 B2 * | 12/2003 | Cernea | ............... | G11C 11/5621 365/185.2 |
| 8,982,634 B2 * | 3/2015 | Tsai | ................... | G11C 13/0064 365/185.18 |
| 2002/0084815 A1 * | 7/2002 | Murphy | ............... | H03L 7/0891 327/157 |
| 2003/0098736 A1 * | 5/2003 | Uchikoba | ............... | H02M 3/07 327/534 |
| 2004/0062301 A1 * | 4/2004 | Yamaguchi | ............. | H04L 1/205 375/226 |
| 2004/0105311 A1 * | 6/2004 | Cernea et al. | ............ | 365/185.21 |
| 2006/0083049 A1 * | 4/2006 | Chandler | ............... | G11C 11/22 365/145 |
| 2010/0020624 A1 * | 1/2010 | Mayor | ................... | G11C 7/065 365/189.15 |
| 2011/0066740 A1 * | 3/2011 | Campagna | ............ | H04J 3/0682 709/230 |
| 2011/0222355 A1 * | 9/2011 | Nakashima | .......... | G11C 13/004 365/189.09 |
| 2011/0235403 A1 * | 9/2011 | Kang | ................. | G11C 13/0004 365/148 |
| 2011/0291761 A1 * | 12/2011 | Rao | ........................ | G11C 11/16 330/277 |
| 2012/0069638 A1 * | 3/2012 | Matsuda | ................ | G11C 11/16 365/158 |
| 2012/0079330 A1 * | 3/2012 | Kawaguchi | ...... | G11C 29/56012 714/718 |
| 2013/0010533 A1 * | 1/2013 | Bedeschi | ........... | G11C 13/0004 365/163 |
| 2013/0258312 A1 * | 10/2013 | Lewis | ................... | G01S 7/4865 356/4.01 |
| 2014/0039823 A1 * | 2/2014 | Raghupathy | ............ | G01S 5/021 702/94 |
| 2014/0153313 A1 * | 6/2014 | Boujamaa | ................ | G11C 7/14 365/148 |
| 2014/0169063 A1 * | 6/2014 | August | .............. | G11C 11/1673 365/148 |
| 2015/0023460 A1 * | 1/2015 | Campagna | ..................... | 375/371 |
| 2015/0117122 A1 * | 4/2015 | Lee | .................... | H03K 19/0005 365/189.11 |
| 2015/0130521 A1 * | 5/2015 | Gomm | ................. | H03L 7/0802 327/158 |

\* cited by examiner

*Primary Examiner* — Hoai V Ho
*Assistant Examiner* — Pablo Huerta
(74) *Attorney, Agent, or Firm* — Blakely, Sokoloff, Taylor & Zafman LLP

(57) ABSTRACT

Described are apparatuses for time domain offset cancellation. One example of the apparatus includes: a variable resistance memory cell; a reference resistive memory cell; a detector to generate an output indicating timing relationship between a pulse arriving from the variable resistance memory cell and a pulse arriving from the reference resistive memory cell; and a logic unit to receive the output from the detector and to generate a control signal to the adjust timing relationship as indicated by the detector.

19 Claims, 5 Drawing Sheets

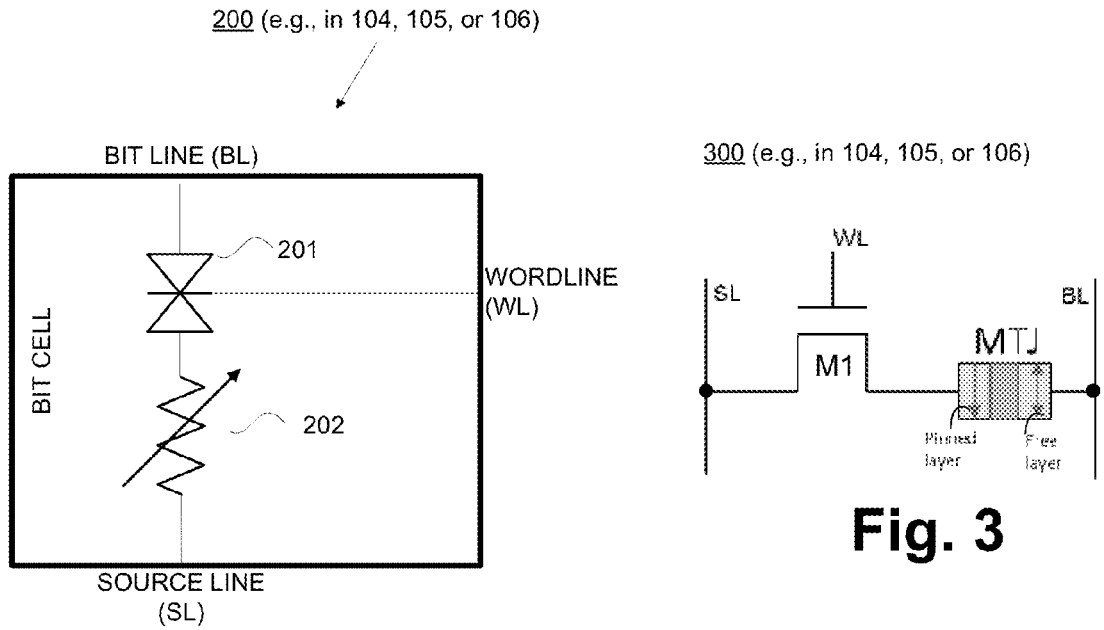
Fig. 2
Fig. 3
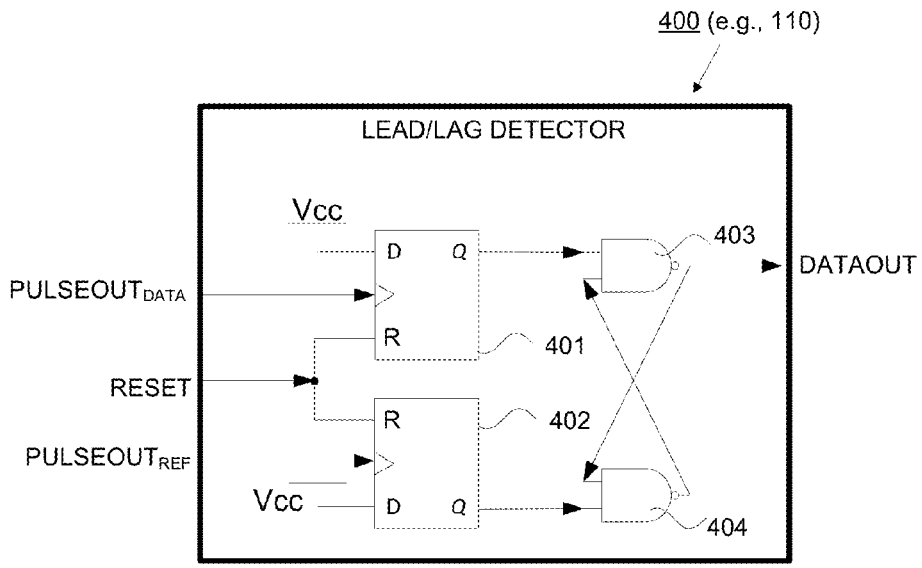
Fig. 4

APPARATUS FOR TIME DOMAIN OFFSET CANCELLATION TO IMPROVE SENSING MARGIN RESISTIVE MEMORIES

BACKGROUND

Several new types of solid-state, high-density, non-volatile memories store information using a memory element with a variable resistance. For example, the resistance of spin transfer torque-magnetic random access memory (STT-MRAM) depends on the relative magnetization polarities of two magnetic layers; resistive RAM (ReRAM) and conductive bridging RAM (CBRAM) depend on the formation and elimination of conduction paths through a dielectric or an electrolyte; and phase change memory (PCM) depends on the crystalline or amorphous state of a chalcogenide.

These non-volatile memories, supporting circuitry, and interconnections suffer from effects of random variations. For example, random variations may cause a voltage or current offset (error) to develop between the data and reference measurements.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2 illustrates a bit-cell used in architecture of FIG. 1, according to one embodiment of the disclosure.

FIG. 3 illustrates a bit-cell used in architecture of FIG. 1, according to another embodiment of the disclosure.

FIG. 4 illustrates a lead-lag detector used in architecture of FIG. 1, according to another embodiment of the disclosure.

DETAILED DESCRIPTION

Figure 1:
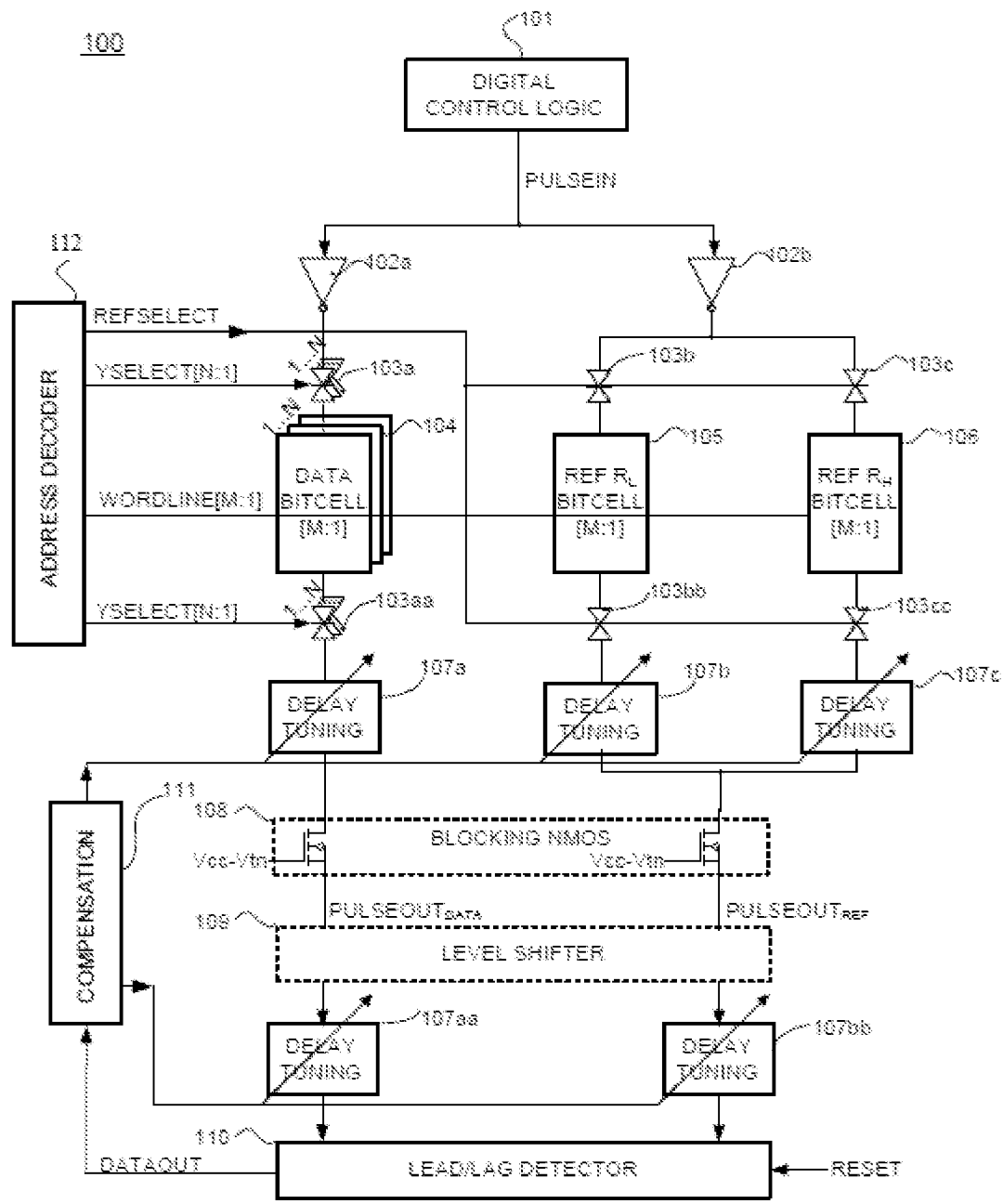
FIG. 1 illustrates architecture for time domain offset cancellation for resistive memories, according to one embodiment of the disclosure.

To improve read margin for memories using resistive elements, existing designs may cancel offset in the voltage or current domains. For example, a voltage differential between the reference and data measurements may be captured in a first measurement phase and stored on a capacitor for use in a second measurement phase. Such compensation techniques are analog in nature and thus susceptible to leakage and process variation. Digital conversion of current or voltage offsets is not practical due to the size and power consumption of a data converter with the required resolution.

The embodiments address the problem of reading in resistive memory arrays, which requires reliably detecting the resistance of the memory element in the array. Previous solutions apply a constant DC current or voltage to the resistive memory element. A sense amplifier or current mirror then compares the resulting current or voltage to that of a reference cell.

The embodiments leverage the ability of advanced CMOS manufacturing processes to measure and to generate sub-ps (sub picoseconds) time delays. In one embodiment, in an initial calibration phase at start up, time offset between corresponding data paths and reference paths in the memory array are digitally captured. During normal memory read operations, the embodiments re-use the measurement circuitry to apply self-compensated digital tuning in the time domain that cancels the previously measured offset.

Although the underlying memory element for resistive memory technologies varies, embodiments of the present invention are electrically similar when applied to any resistive memory. For illustration purposes, the embodiments are described with reference to STT-MRAM.

By operating in the time domain, the embodiments sidestep the difficulties of existing reading and compensation methods that operate in the analog voltage and current domains. With typical time-domain read margins in the range of tens to hundreds of ps, some embodiments have the ability to cancel offsets to within less than 1% of the nominal read margin when implemented in advanced CMOS technologies. In the following embodiments, the term "Write0" refers to write operation to write a logical low to the memory element, and "Write1" refers to write operation to write a logical high to the memory element.

Although the underlying memory element for resistive memory technologies varies, methods for reading and writing are electrically similar and are encompassed by embodiments. The embodiments can be combined to achieve the best energy savings for resistive memories.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates architecture 100 for time domain offset cancellation for resistive memories, according to one embodiment of the disclosure. In one embodiment, architecture 100 includes one or more circuits that detect the state of a variable resistance memory element in a memory array via calibrated time-domain sensing of pulse edges.

In one embodiment, architecture 100 comprises Digital Control Logic 101, inverters or buffers (or read drivers) 102a and 102b, input column select multiplexers 103a, input reference multiplexers 103b and 103c, memory array 104, Address Decoder 112, first column of reference cells 105, second column of reference cells 106, output column select multiplexers 103aa, output reference multiplexers 103bb and 103cc, first tunable delay elements 107a, 107b, and 107c; Blocking Unit 108, Level Shifter 109, second tunable delay elements 107aa and 107bb; Lead-Lag Detector 110, and Compensation Unit 111 (or logic unit).

In one embodiment, memory array 104 includes M-rows and N-columns of data bit-cells, each with a resistive memory element that assumes either a lower resistance state with resistance $R_L$ or a higher resistance state with resistance $R_H$. Here, 'M' and 'N' are integers. In one embodiment, for every 'N' column of data bit-cells in array 104, there is a single M-row column of reference bit-cells 105 normally in the lower resistance state $R_L$ and a single M-row column of reference bit-cells 106 normally in the higher resistance state $R_H$. In one embodiment, instead of columns of reference bit-cells 105 and 106, rows of reference bit-cells may be used. In one embodiment, during a read operation, Address Decoder 112 selects one row and one column of the memory array 104 to address a single data bit-cell in array 104.

In one embodiment, YSELECT[N:1] signal selects the column, and WORDLINE[M:1] signal selects the row from memory array 104. Likewise, in one embodiment, for the reference array of bit-cells 105 and 106, WORDLINE[M:1] signal selects the same row in the reference array (i.e., 105 and 106) as the row for data cell in memory array 104, and the REFSELECT signal selects both reference columns. In one embodiment, Address Decoder 112 provides YSELECT[N:1], WORDLINE[M:1], and REFSELECT signals. In one embodiment, selection by REFSELECT signal activates access devices 103b and 103c (also referred here as part of the first column select multiplexer) that electrically couples the read driver(s) 102a/b on the SOURCELINE to the read sensing circuitry (i.e., Level Shifter 109 and Lead-Lag Detector 110) on the bit-line. In one embodiment, access devices 103a, 103b, 103c, 103aa, 103bb, and 103cc, may be an NMOS transistor, a PMOS transistor, or a CMOS pass-gate.

In one embodiment, to sense the state of the selected data bit-cell from array 104, Digital Control Logic 101 sends a pulse on the PULSEIN at the nominal digital supply voltage. Here, labels for signals and nodes are interchangeably used. For example, PULSEIN is used to indicate node PULSEIN or signal PULSEIN depending on context of the sentence.

In one embodiment, drivers 102a and 102b on both the data array 104 and the reference arrays (i.e., 105 and 106) drive input pulse PULSEIN through the data bit-cell of array 104 and in parallel through both reference bit-cells (of reference array 105 and 106) at a voltage level that is equal to or lower than the nominal supply. In one embodiment, input pulse PULSEIN emerges at the bottom of the data array 104 as $PULSEOUT_{DATA}$ and at the bottom of reference arrays (i.e., 105 and 106) as $PULSEOUT_{REF}$.

In one embodiment, pulses (i.e., $PULSEOUT_{DATA}$ and $PULSEOUT_{REF}$) may travel through Level Shifter 109. In one embodiment, Level Shifter 109 is optional. In one embodiment, pulses (i.e., $PULSEOUT_{DATA}$ and $PULSEOUT_{REF}$) may travel through Blocking Unit 108 that separates voltage domains. In one embodiment, Blocking Unit 108 comprises n-type devices, one in the data path and one in the reference path. In one embodiment, gate terminals of the n-type device in Blocking Unit 108 are biased to Vcc-Vtn level, where Vtn is the threshold voltage of the n-type devices. In one embodiment, Blocking Unit 108 is optional.

In one embodiment, RC delay through the parallel reference path lies between the RC delay of a data path with $R_{DATA}=R_L$ and the RC delay of a data path with $R_{DATA}=R_H$, where "$R_{DATA}$" is the resistance of the data path. In such an embodiment, the relative arrival order of $PULSEOUT_{DATA}$ signal with respect to $PULSEOUT_{REF}$ signal identifies the state of the variable-resistance memory element in the data bit-cell of array 104. Here, $PULSEOUT_{DATA}$ and $PULSEOUT_{REF}$ also refer to nodes in the data path and the reference path respectively after corresponding Delay Tuning Units 107a and 107b/c.

In one embodiment, Compensation Unit 111 receives output of Lead-Lag Detector 110 (which indicates the timing relationship between $PULSEOUT_{DATA}$ signal with respect to $PULSEOUT_{REF}$ signal) to compensate for offset in the data path and/or reference path. In one embodiment, Compensation Unit 111 compensates (or substantially cancels) the offset by adjusting delay in the signal paths of data path and/or reference path. In one embodiment, Delay Tuning Units (i.e., 107a, 107b, 107c, 107aa, 107bb) are used to adjust delays in the signal paths of data path and/or reference path. In one embodiment, all Delay Tuning Units (i.e., 107a, 107b, 107c, 107aa, 107bb) need not be present, and Delay Tuning Units may be placed in one place or multiple places in the data and/or reference paths to compensate for offset.

In one embodiment, output of Compensation Unit 111 controls one or more Delay Tuning Units. In one embodiment, Compensation Unit 111 is operable to inject an input pulse like PULSEIN through a multiplexer (not shown) at any point in the signal paths of data path and reference path. In such an embodiment, offset cancellation is performed with reference to circuits and interconnects in the signal path from the injection point of the input pulse (also referred here as CALIBRATION PULSE) to the output of the Lead/Lag Detector 110.

In one embodiment, to initiate offset cancellation or compensation of offset (i.e., when architecture 100 is being compensated for offset variations), Compensation Unit 111 first injects a CALIBRATION PULSE at an injection point for both the data path and reference path. In such an embodiment, tuning units (e.g., 107a, 107b, 107c, 107aa, 107bb) are set to their base tuning settings. In one embodiment, Compensation Unit 111 adjusts the TRIM values for the tuning units to adjust RC time constant in the signal path of data and/or reference path. In one embodiment, Compensation Unit 111 monitors the output DATAOUT to determine when it changes its value (i.e., changes from '1' to '0' or '0' to '1'). The TRIM setting for which DATAOUT changes its value is stored by Compensation Unit 111. In one embodiment, this stored value for TRIM settings is used to calibrate architecture 100 to cancel (or substantially cancel) offset to improve read margin.

FIG. 2 illustrates a bit-cell 200 (e.g., of arrays 104, 105, 106) used in architecture of FIG. 1, according to one embodiment of the disclosure. It is pointed out that those elements of FIG. 2 having the same reference numbers (or names) as the elements of any other figure can operate or function in any manner similar to that described, but are not limited to such.

In one embodiment, bit-cell 200 comprises select device 201 and resistive memory element 202. In one embodiment, select device 201 is an n-type device, p-type device, or combination of both. In one embodiment, resistive memory element 202 has a first terminal coupled to SOURCE LINE (SL) and a second terminal coupled to the select device 201. In one embodiment, select device 201 is turned ON or OFF by WORDLINE (WL). In one embodiment, one terminal of select device 201 is coupled to BITLINE (BL). In one embodiment, resistive memory element 202 is one of magnetic random access memory (STT-MRAM) which depends on the relative magnetization polarities of two magnetic layers; resistive RAM (ReRAM) and conductive bridging RAM (CBRAM) which depends on the formation and elimination of conduction paths through a dielectric or an electrolyte; or phase change memory (PCM) which depends on the crystalline or amorphous state of a chalcogenide. STT-MRAM based memory can be formed from Magnetic Tunnel Junction (MTJ) devices.

FIG. 3 illustrates a bit-cell 300 (e.g., of arrays 104, 105, 106) used in architecture of FIG. 1, according to another embodiment of the disclosure. It is pointed out that those elements of FIG. 3 having the same reference numbers (or names) as the elements of any other figure can operate or function in any manner similar to that described, but are not limited to such.

In this embodiment, bit-cell 300 includes an access transistor M1 and an MTJ device. In one embodiment, the access transistor M1 is an n-type device with its source/drain terminal coupled to SL and drain/source terminal coupled to a first terminal of the MTJ device. In one embodiment, the gate terminal of M1 is controlled by WL. In one embodiment, a second terminal of MTJ device is coupled to BL.

The MTJ device is the storage element of STT-MRAM, which includes a pinned magnetic layer and a free magnetic layer. The free magnetic layer magnetization orientation can change with the write current direction. If the write current flows from the free magnetic layer to the pinned magnetic layer, the free magnetic layer magnetization aligns with the pinned magnetic layer and the MTJ device is in the parallel state ($R_P$) with low resistance $R_L$. If the write current flows from the pinned magnetic layer to the free magnetic layer, the free magnetic layer magnetization direction opposes the pinned magnetic layer and the MTJ device is in the anti-parallel ($R_{AP}$) state with high resistance $R_H$. In one embodiment, the pinned layer of the MTJ device is coupled to BL and the free layer of the MTJ device is coupled to transistor M1. In one embodiment, transistor M1 (i.e., the access transistor) is coupled to wither BL or SL. For example, transistor M1 is coupled to BL and MTJ is coupled to SL.

Referring back to FIG. 1, in one embodiment, the sensing circuitry (which includes Lead-Lag Detector 110 and optional Level Shifter 109) detects the arrival order of $PULSEOUT_{DATA}$ with respect to $PULSEOUT_{REF}$. In one embodiment, Lead-Lag Detector 110 is operable to generate a DATAOUT signal which is a one bit signal indicating timing relationship of $PULSEOUT_{DATA}$ with respect to $PULSEOUT_{REF}$. For example, if DATAOUT is '0' then $PULSEOUT_{DATA}$ lags in time relative to $PULSEOUT_{REF}$, or visa versa.

FIG. 4 illustrates a Lead-Lag Detector 400 (e.g., 110) used in architecture of FIG. 1, according to another embodiment of the disclosure. It is pointed out that those elements of FIG. 4 having the same reference numbers (or names) as the elements of any other figure can operate or function in any manner similar to that described, but are not limited to such.

In one embodiment, Lead-Lag Detector 400 comprises sequential units 401 and 402; and NAND gates 403 and 404. In one embodiment, NAND gates 403 and 404 are cross-coupled to form an RS-latch. In one embodiment, output of NAND gate 403 (or 404) is DATAOUT. In one embodiment, sequential units 401 and 402 are D-flip-flops. In one embodiment, the D-flip-flops are high-gain D-flip flops. In one embodiment, sequential units 401 and 402 are resettable by RESET signal.

In one embodiment, high-gain D-flip-flops 401 and 402 are placed on the reference and data paths followed by the high-gain cross-coupled NAND gates 403 and 404. In one embodiment, after RESET, D-flip-flops 401 and 402 preserve the order of the rising edges of the data and reference pulses (i.e., $PULSEOUT_{DATA}$ and $PULSEOUT_{REF}$ respectively) and prevent the falling edges from disturbing the DATAOUT output.

For example, if a $PULSEOUT_{REF}$ edge arrives first, the cross-coupled NAND gates 403 and 404 latch a data '0' on the DATAOUT signal until RESET. Continuing with the example, if a $PULSEOUT_{DATA}$ edge arrives first, the cross-coupled NAND gates 403 and 404 latch a data '1' on the DATAOUT signal until RESET. In one embodiment, optional Level Shifter 109 may be used if the access devices 103aa, 103bb, or 103cc do not provide full CMOS level signals to Lead/Lag Detector 110.

Figure 5:
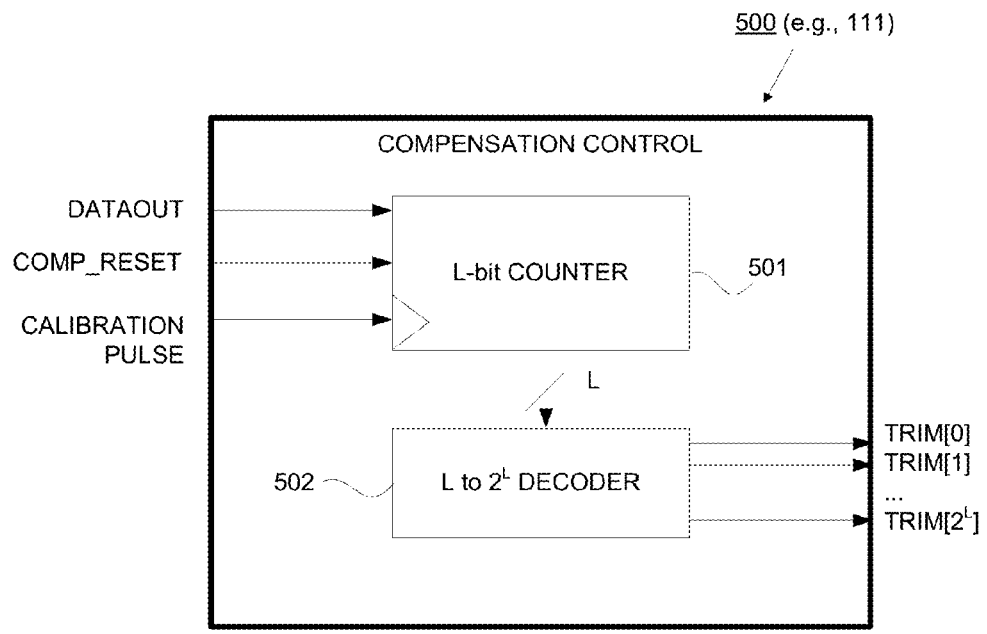
FIG. 5 illustrates a Compensation Unit, according to one embodiment of the disclosure.

FIG. 5 illustrates a Compensation Unit 500 (e.g., 111), according to one embodiment of the disclosure. It is pointed out that those elements of FIG. 5 having the same reference numbers (or names) as the elements of any other figure can operate or function in any manner similar to that described, but are not limited to such.

In one embodiment, Compensation Unit 500 comprises an L-bit Counter 501 and Decoder 502. In one embodiment, L-bit Counter 501 receives DATAOUT, COMP_RESET (same as RESET), and CALIBRATION PULSE and generates L-bit output. In one embodiment, the L-bit output is count value which is decoded by Decoder 502. In one embodiment, Decoder 502 is an L to $2^L$ decoder that decodes L-bit output of Counter 501 into TRIM signals—TRIM[0]-[$2^L$], where 'L' is an integer.

In one embodiment, Compensation Unit 500 increments or decrements a count value of L-bit counter 500, depending on the value of the 1-bit DATAOUT signal from the Lead-Lag Detector 110. In one embodiment, Decoder 502 converts the numerical value of Counter 501 to a $2^L$-bit thermometer coded output TRIM. In one embodiment, Compensation Unit 500 is implemented as a shift counter without a decoder. In one embodiment, TRIM signal controls one or more delay tuning blocks (e.g., 107a, 107b, 107c, 107aa, and 107bb).

Figure 6:
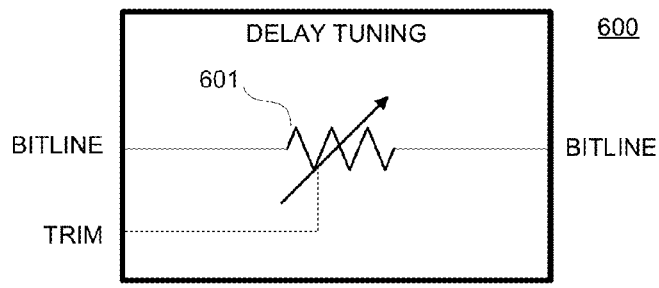
FIG. 6 illustrates a Delay Tuning Unit, according to one embodiment of the disclosure.

FIG. 6 illustrates a Delay Tuning Unit 600 (e.g., 107a, 107b, 107c, 107aa, and 107bb), according to one embodiment of the disclosure. It is pointed out that those elements of FIG. 6 having the same reference numbers (or names) as the elements of any other figure can operate or function in any manner similar to that described, but are not limited to such.

In one embodiment, Delay Tuning Unit 600 is a variable resistor 601 (e.g., adjustable resistance of transistor). In one embodiment, variable resistor 601 is controllable by TRIM signal generated by Compensation Unit 500. In one embodiment, variable resistor 601 is coupled in series with BIT-LINE.

Figure 7:
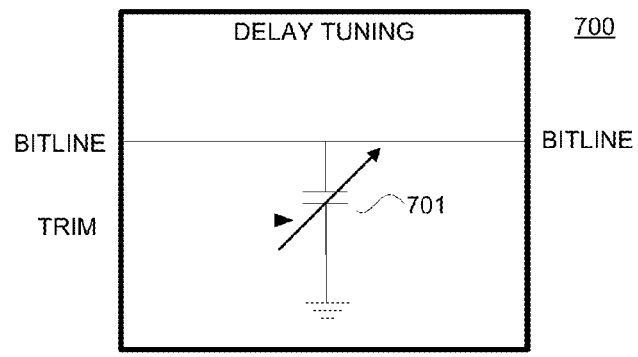
FIG. 7 illustrates a Delay Tuning Unit, according to another embodiment.

FIG. 7 illustrates a Delay Tuning Unit 700 (e.g., 107a, 107b, 107c, 107aa, and 107bb), according to another embodiment of the disclosure. It is pointed out that those elements of FIG. 7 having the same reference numbers (or names) as the elements of any other figure can operate or function in any manner similar to that described, but are not limited to such. In one embodiment, Delay Tuning Unit 700 is a variable (or tunable) capacitor 701. In one embodiment, variable (or trimable) resistor 701 is controllable by TRIM signal generated by Compensation Unit 500.

In one embodiment, variable capacitor 701 is coupled to BL and ground. In one embodiment, variable resistance and capacitance elements 600 and 700 respectively may be implemented with transistors, metal, poly-silicon, or other suitable materials or combinations of materials readily available in CMOS (or other) manufacturing processes. In one embodiment, Delay Tuning Unit may comprise both a variable capacitor and a trimable resistor (i.e., elements of Delay Tuning Unit 600 and 700 are combined together).

Referring back to FIG. 1 in view of other figures, in one embodiment, in a first measurement phase at start up, time offset between corresponding data and reference paths is digitally captured. In one embodiment, for subsequent reads during normal operation, the measurement circuitry is re-used to provide self-compensated digital tuning in the time domain that cancels the previously measured offset.

In one embodiment, first phase measurement may occur once at start-up or repeatedly at fixed or variable time intervals. In one embodiment, an input CALIBRATION PULSE signal (similar to PULSEIN signal) clocks L-bit COUNTER 501 and is also injected at any common point along the reference and data paths. For example, in one embodiment, the CALIBRATION PULSE is injected at node PULSEIN to calibrate all potential signal paths through each data cell in array 104, starting from the Digital Control Logic 101 and ending at Lead-Lag Detector 110.

In one embodiment, to reduce the number of calibrations, shared portions of the path may be calibrated. For example, CALIBRATION PULSE may be injected on the array 104 side of the bottom YSELECT multiplexers (i.e., 103a, 103b, 103c, 103aa, 103bb, and 103cc) to reduce the number of calibrations by a factor equal to the number of rows. In one embodiment, CALIBRATION PULSE is injected at the input of Blocking Unit 108 (i.e., separator) to reduce the number of calibrations by a factor equal to the number of rows multiplied by the number of columns. In this embodiment, when CALIBRATION PULSE is injected at Digital Control Logic 101, reference cells 105/106 and the data cells in array 104 are written to the same resistance state prior to calibration. In one embodiment, when CALIBRATION PULSE is injected below reference arrays 105/106 and data cells in array 104, no writes are necessary prior to calibration.

In one embodiment, at each rising (or falling) edge of the CALIBRATION PULSE, Compensation Unit 111 increments, decrements, or halts Counter 501 based on the DATAOUT signal from Lead-Lag Detector 110. In one embodiment, the decoded TRIM signal then adjusts a delay tuning block (e.g., 107a, 107b, 107c, 107aa, or 107bb) on either (or both) the reference or data path, such that the offset between the reference and data paths is reduced.

For example, if the DATAOUT signal indicates that the reference path is slower than the data path, then a delay tuning block adds delay to the data path or removes delay from the reference path. In one embodiment, to terminate the calibration phase, Compensation Unit 111 may start at the lowest delay setting (in the delay tuning units) and wait until the Lead/Lag Detector 110 output DATAOUT changes. In another embodiment, Compensation Unit 111 may terminate the calibration phase when DATAOUT signal achieves steady state behavior alternating between '0' and '1'.

In one embodiment, once the calibration loop terminates, the measurement phase ends and no additional CALIBRATION PULSES are applied. In one embodiment, Counter 501 in Compensation Unit 111 maintains storage of the optimal TRIM setting for subsequent reads during normal operation. In one embodiment, the same tuning elements perform the measurement and supply the TRIM. In such an embodiment, the TRIM is self-calibrated.

Figure 8:
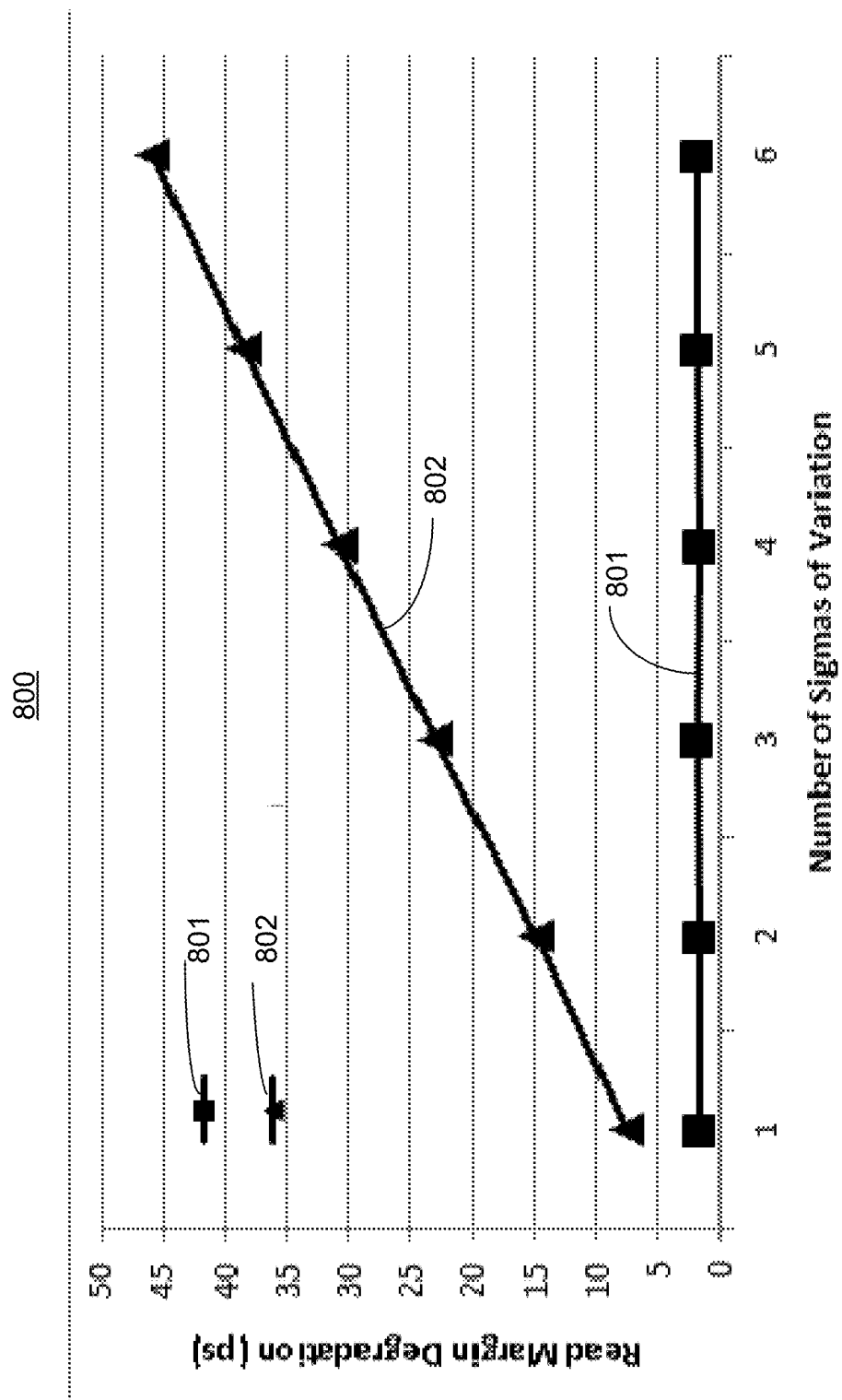
FIG. 8 illustrates a plot showing effective time domain offset with and without the embodiments.

FIG. 8 illustrates a plot 800 showing effective time domain offset with and without the embodiments. It is pointed out that those elements of FIG. 8 having the same reference numbers (or names) as the elements of any other figure can operate or function in any manner similar to that described, but are not limited to such.

Here, x-axis is numbers of sigma variation, and y-axis is degradation in read margin measured in ps. Plot 800 shows two waveforms—waveform 801 is the effective time domain offset with the embodiments and waveform 802 is the effective time domain offset without the embodiments. In this example, because of random variation, a baseline design (i.e., waveform 802) without the embodiments incurs about 7.6 ps per sigma of read margin degradation (out total read margin of 48 ps, for example). The embodiments compensate for variation between the reference and data paths, and the resulting effective time domain offset is a fraction of the 1-sigma variation. Plot 801 shows that the embodiments almost completely cancel the effects of random variation. The embodiments are also robust against leakage and process variation due to their digital implementation.

Figure 9:
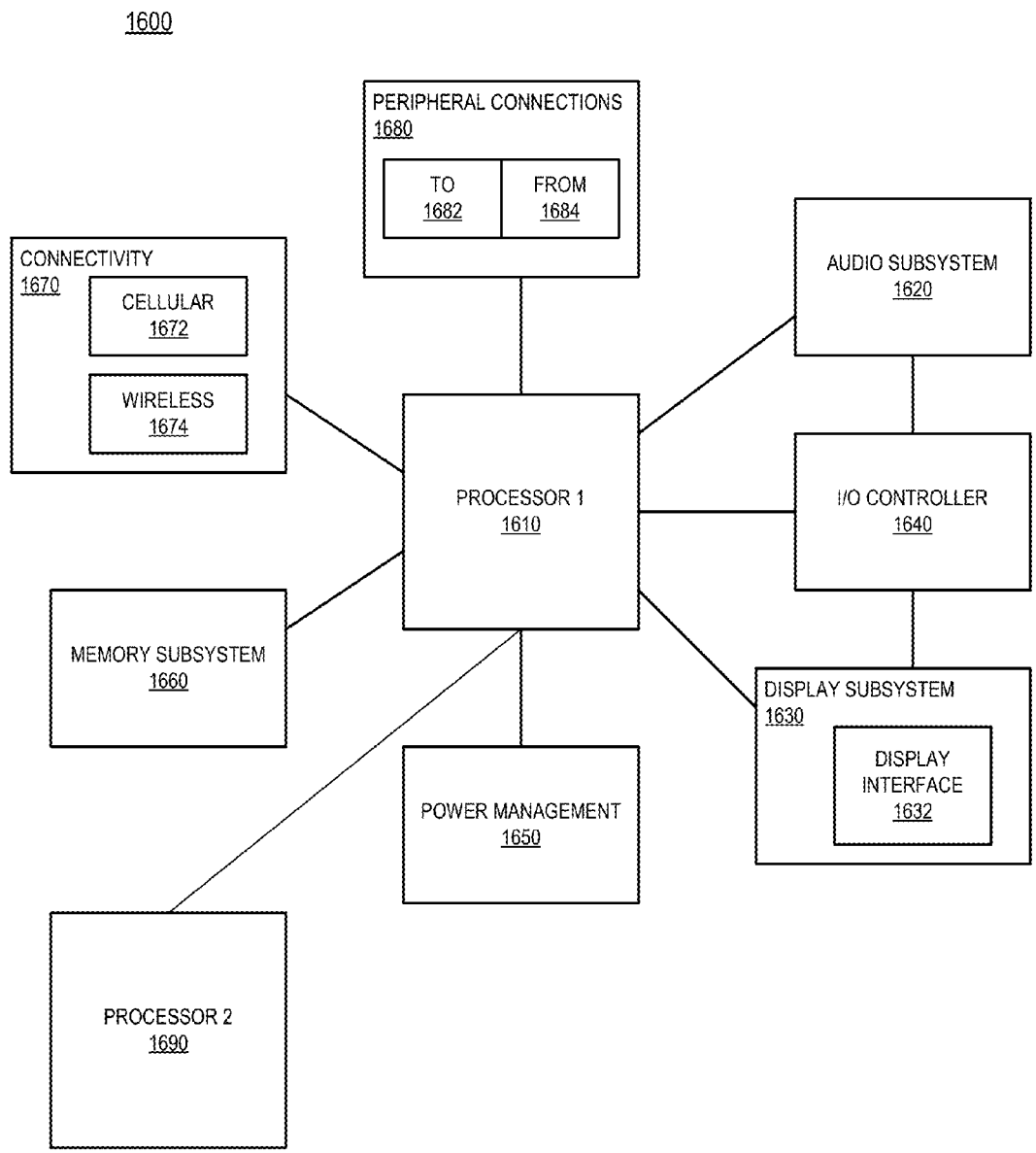
FIG. 9 is a smart device or a computer system or an SoC (System-on-Chip) with architecture for time domain offset cancellation for resistive memories, according to one embodiment of the disclosure.

FIG. 9 is a smart device or a computer system or an SoC (System-on-Chip) with architecture for time domain offset cancellation for resistive memories, according to one embodiment of the disclosure. It is pointed out that those elements of FIG. 9 having the same reference numbers (or names) as the elements of any other figure can operate or function in any manner similar to that described, but are not limited to such.

FIG. 9 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with architecture for time domain offset cancellation for resistive memories described with reference to embodiments. Other blocks of the computing device 1600 may also include any of the architectures for time domain offset cancellation for resistive memories described with reference to embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. Processor 1690 may be optional. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus is provided which comprises: a variable resistance memory cell; a reference resistive memory cell; a detector to generate an output indicating timing relationship between a pulse arriving from the variable resistance memory cell and a pulse arriving from the reference resistive memory cell; and a logic unit to receive the output from the detector and to generate a control signal to the adjust timing relationship as indicated by the detector. In one embodiment, the apparatus further comprises a first tunable element coupled in a signal path between the variable resistance memory cell and the detector. In one embodiment, the detector to generate the control signal for adjusting delay of the first tunable element. In one embodiment, the first tunable element comprises a tunable resistor or a tunable capacitor or both.

In one embodiment, the apparatus further comprises a second tunable element coupled in a signal path between the reference resistive memory cell and the detector. In one embodiment, the detector to generate the control signal for adjusting delay of the second tunable element. In one embodiment, the second tunable element comprises a tunable resistor or a tunable capacitor or both. In one embodiment, wherein the variable resistance memory cell and the reference resistive memory cell is at least one of a cell of: STT-MRAM; ReRAM; PCM; or CBRAM. In one embodiment, the logic unit to receive the output from the detector and to inject a pulse in a signal path of the variable resistance memory cell and in a signal path of the reference resistive memory cell. In one embodiment, the logic unit comprises a counter. In one embodiment, the logic unit further comprises a decoder to decode output of the counter, wherein the decoder to generate the control signal.

In another example, an apparatus is provided which comprises: a digital control logic to provide a pulse; an array of variable resistance memory cells; reference resistive memory bit-cells; column select multiplexer coupled to the array and the reference resistive memory bit-cells, the column select multiplexer to select a column of variable resistance memory cells in the array; a wordline to select a bit-cell from the selected column of variable resistance memory cells and to select a reference bit-cell from the reference resistive memory bit-cells, the pulse to pass through a signal path having the selected bit-cell and a signal path having the selected reference bit-cell; a detector to generate an output indicating timing relationship between the pulse arriving from the selected bit-cell and another pulse arriving from the selected reference bit-cell; and a logic unit to receive the output from the detector and to generate a control signal to the adjust timing relationship as indicated by the detector.

In one embodiment, the variable resistance memory cells and the reference resistive memory cells have at least one of a cell of: STT-MRAM; ReRAM; PCM; or CBRAM. In one embodiment, the logic unit to receive the output from the detector and to inject a different pulse in the signal path after the variable resistance memory cells and in a signal path after the reference resistive memory cells. In one embodiment, the logic unit comprises a counter. In one embodiment, the logic unit further comprises a decoder to decode output of the counter, wherein the decoder to generate the control signal.

In another example, a system is provided which comprises: a processor; a wireless interface for allowing the processor to communicate with another device; and a memory coupled to the processor, the memory including the apparatus discussed above. In one embodiment, the system further comprises a display unit for displaying content processed by the processor. In one embodiment, the display unit is a touch screen.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a variable resistance memory cell;
a reference resistive memory cell;
a detector to generate an output indicating timing relationship between a pulse arriving from the variable resistance memory cell and a pulse arriving from the reference resistive memory cell; and
a logic unit to receive the output from the detector and to generate a control signal to adjust the timing relationship as indicated by the detector,
wherein the variable resistance memory cell is coupled to the detector via a first tunable element and the reference resistive memory cell is coupled to the detector via a second tunable memory cell.

2. The apparatus of claim 1, wherein the detector is configured to generate the control signal for adjusting delay of the first tunable element.

3. The apparatus of claim 1, wherein the first tunable element comprises a variable resistor or a tunable capacitor or both.

4. The apparatus of claim 1, wherein the detector is configured to generate the control signal for adjusting delay of the second tunable element.

5. The apparatus of claim 4, wherein the second tunable element comprises a variable resistor or a variable capacitor or both.

6. The apparatus of claim 1, wherein the variable resistance memory cell and the reference resistive memory cell is at least one of a cell of:
STT-MRAM;
ReRAM;
PCM; or
CBRAM.

7. The apparatus of claim 1, wherein the logic unit is configured to receive the output from the detector and to inject a pulse in a signal path of the variable resistance memory cell and in a signal path of the reference resistive memory cell.

8. The apparatus of claim 1, wherein the logic unit comprises a counter.

9. The apparatus of claim 8, wherein the logic unit further comprises a decoder configured to decode output of the counter, wherein the decoder to generate the control signal.

10. An apparatus comprising:
a digital control logic to provide a pulse;
an array of variable resistance memory cells;
reference resistive memory bit-cells;
column select multiplexer coupled to the array and the reference resistive memory bit-cells, the column select multiplexer to select a column of variable resistance memory cells in the array;
a wordline to select a bit-cell from the selected column of variable resistance memory cells and to select a reference bit-cell from the reference resistive memory bit-cells, the pulse to pass through a signal path having the selected bit-cell and a signal path having the selected reference bit-cell;
a detector to generate an output indicating timing relationship between the pulse arriving from the selected bit-cell and another pulse arriving from the selected reference bit-cell; and
a logic unit to receive the output from the detector and to generate a control signal to adjust the timing relationship as indicated by the detector,
wherein the array of variable resistance memory cells are coupled to the detector via a first tunable element and the reference resistive memory bit-cells are coupled to the detector via a second tunable memory cell.

11. The apparatus of claim 10, wherein the variable resistance memory cells and the reference resistive memory cells have at least one of a cell of:
STT-MRAM;
ReRAM;
PCM; or
CBRAM.

12. The apparatus of claim 10, wherein the logic unit is configured to receive the output from the detector and to inject a different pulse in the signal path after the variable resistance memory cells and in a signal path after the reference resistive memory cells.

13. The apparatus of claim 10, wherein the logic unit comprises a counter.

14. The apparatus of claim 13, wherein the logic unit further comprises a decoder configured to decode output of the counter, wherein the decoder to generate the control signal.

15. A system comprising:
a processor;
a wireless interface for allowing the processor to communicate with another device; and
a memory coupled to the processor, the memory including:
a variable resistance memory cell;
a reference resistive memory cell;
a detector to generate an output indicating timing relationship between a pulse arriving from the variable resistance memory cell and a pulse arriving from the reference resistive memory cell; and
a logic unit to receive the output from the detector and to generate a control signal to adjust the timing relationship as indicated by the detector,
wherein the variable resistance memory cell is coupled to the detector via a first tunable element and the reference resistive memory cell is coupled to the detector via a second tunable memory cell.

16. The system of claim 15 further comprises a display unit for displaying content processed by the processor.

17. The system of claim 16, wherein the display unit is a touch screen.

18. The system of claim 15, wherein the variable resistance memory cell and the reference resistive memory cell is at least one of a cell of:
STT-MRAM;
ReRAM;
PCM; or
CBRAM.

19. The apparatus of claim 1, wherein the detector includes sequential units to preserve an order of rising edges of the pulse arriving from the variable resistance memory cell and the pulse arriving from the reference resistive memory cell.

* * * * *